US012336089B2

(12) United States Patent
Takematsu et al.

(10) Patent No.: US 12,336,089 B2
(45) Date of Patent: Jun. 17, 2025

(54) RADIO FREQUENCY MODULE AND COMMUNICATION DEVICE

(71) Applicant: Murata Manufacturing Co., Ltd., Kyoto (JP)

(72) Inventors: Yuji Takematsu, Kyoto (JP); Takanori Uejima, Kyoto (JP); Dai Nakagawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 300 days.

(21) Appl. No.: 18/310,639

(22) Filed: May 2, 2023

(65) Prior Publication Data

US 2023/0269864 A1 Aug. 24, 2023

Related U.S. Application Data

(63) Continuation of application No. PCT/JP2021/036907, filed on Oct. 6, 2021.

(30) Foreign Application Priority Data

Dec. 7, 2020 (JP) .................................. 2020-202659

(51) Int. Cl.
 *H05K 1/02* (2006.01)
(52) U.S. Cl.
 CPC ... *H05K 1/0243* (2013.01); *H05K 2201/1006* (2013.01); *H05K 2201/10098* (2013.01); *H05K 2201/10507* (2013.01)
(58) Field of Classification Search
 CPC ......... H05K 1/0243; H05K 2201/1006; H05K 2201/10098; H05K 2201/10507

USPC .......................................................... 361/761
See application file for complete search history.

(56) References Cited

U.S. PATENT DOCUMENTS

2019/0289737 A1* 9/2019 Yamamoto .............. H01L 25/50
2020/0381336 A1* 12/2020 Otsubo ............. H01L 23/49822
2021/0233865 A1* 7/2021 Tarui .................... H01Q 21/065
2022/0359420 A1* 11/2022 Kim ........................ H01L 25/03

FOREIGN PATENT DOCUMENTS

| JP | 2018-195756 A | 12/2018 |
| WO | 2014/013831 A1 | 1/2014 |
| WO | 2019/167908 A1 | 9/2019 |

OTHER PUBLICATIONS

International Search Report for PCT/JP2021/036907 dated Dec. 14, 2021.

* cited by examiner

*Primary Examiner* — Binh B Tran
(74) *Attorney, Agent, or Firm* — McDonald Hopkins LLC

(57) ABSTRACT

A radio frequency module includes a module substrate having a main surface, a first circuit component arranged on the main surface, a resin member arranged on the main surface and covering a side surface of the first circuit component, a metal shield layer in contact with a top surface of the resin member and a top surface of the first circuit component, and an engraved portion provided on the top surface of the resin member. When the main surface is viewed in plan, the engraved portion does not overlap the first circuit component.

12 Claims, 4 Drawing Sheets

RADIO FREQUENCY MODULE AND COMMUNICATION DEVICE

CROSS REFERENCE TO RELATED APPLICATION

This is a continuation of International Application No. PCT/JP2021/036907 filed on Oct. 6, 2021 which claims priority from Japanese Patent Application No. 2020-202659 filed on Dec. 7, 2020. The contents of these applications are incorporated herein by reference in their entireties.

BACKGROUND ART

Technical Field

The present disclosure relates to a radio frequency module and a communication device.

Patent Document 1 discloses a module including a module substrate, an electronic component mounted on a mounting surface of the module substrate, and a resin layer covering side surfaces of the electronic component. The upper surface of the electronic component is in contact with a metal film, and heat generated in the electronic component is dissipated through the metal film.

Patent Document 1: International Publication No. 2014/013831

BRIEF SUMMARY

In the radio frequency module, not only improvement in heat dissipation is required, but also easy identification of the radio frequency module is required. An engraving indicating information such as a model number is provided on the surface of the radio frequency module. As the miniaturization of the radio frequency module progresses, the engraving itself becomes smaller, and it is required to keep the visibility of the engraving high.

The present disclosure provides a radio frequency module and a communication device which are excellent in heat dissipation and high in visibility of the engraving.

A radio frequency module according to an aspect of the present disclosure includes a module substrate having a main surface, a first circuit component arranged on the main surface, a resin member arranged on the main surface and covering a side surface of the first circuit component, a metal layer in contact with a top surface of the resin member and a top surface of the first circuit component, and an engraved portion provided on the top surface of the resin member. When the main surface is viewed in plan, the engraved portion does not overlap the first circuit component.

A communication device according to an aspect of the present disclosure includes an RF signal processing circuit configured to process a radio frequency signal transmitted and received by an antenna, and the radio frequency module according to the above aspect configured to transmit the radio frequency signal between the antenna and the RF signal processing circuit.

According to the present disclosure, it is possible to provide a radio frequency module or the like having excellent heat dissipation and high visibility of an engraving.

DETAILED DESCRIPTION

Figure 1:
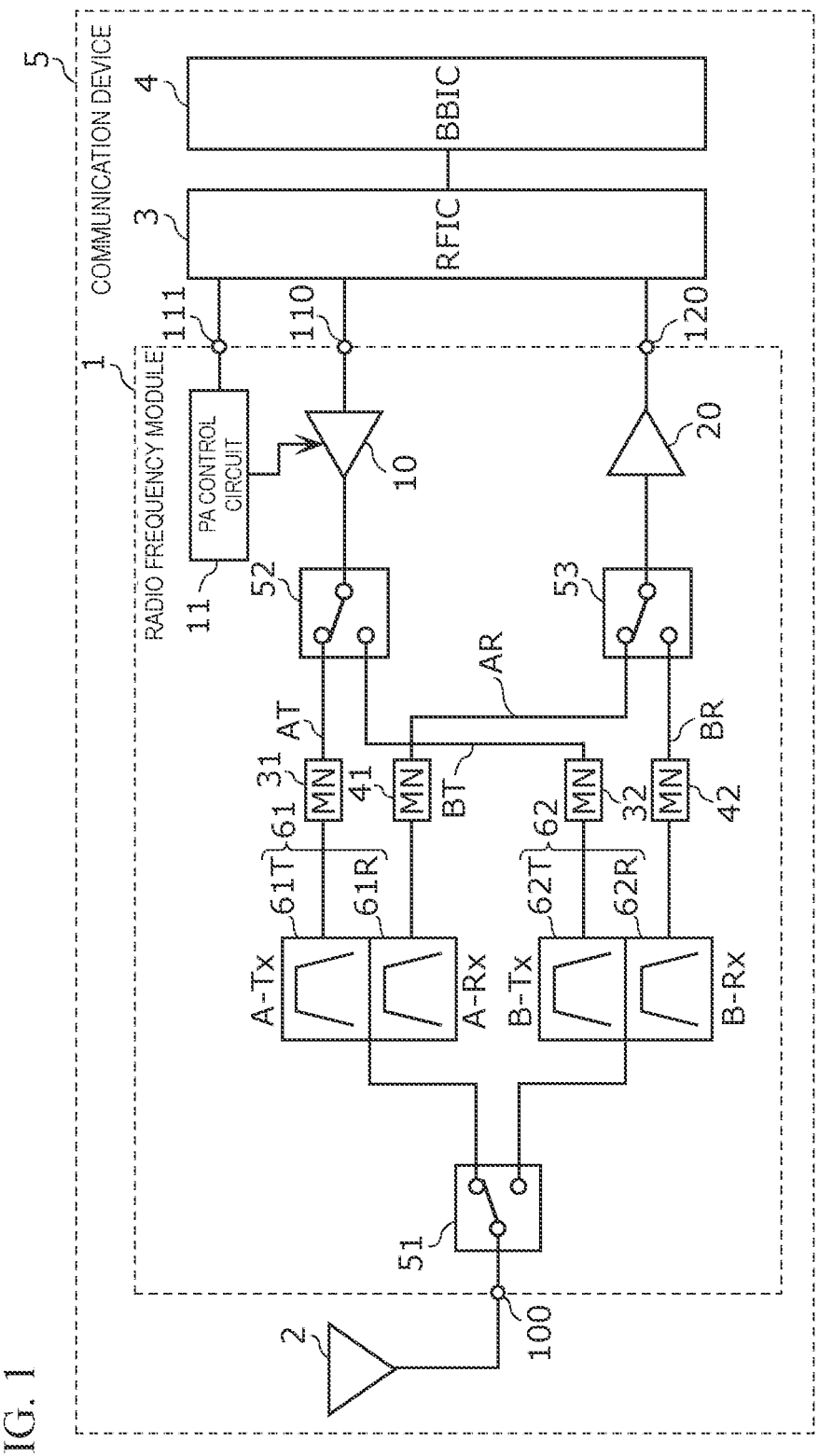
FIG. 1 is a circuit diagram of a radio frequency module and a communication device according to an embodiment.

Hereinafter, a radio frequency module and a communication device according to an embodiment of the present disclosure will be described in detail with reference to the drawings. Note that each of the embodiments described below illustrates a specific example of the present disclosure. Therefore, the numerical values, shapes, materials, components, the arrangement and connection mode of the components, steps, the order of the steps, and the like illustrated in the following embodiments are mere examples, and are not intended to limit the present disclosure. Therefore, among the constituent elements in the following embodiments, constituent elements not recited in any of the independent claims are described as optional constituent elements.

In addition, each drawing is a schematic diagram and is not necessarily strictly illustrated. Therefore, for example, scales and the like do not necessarily coincide with each other in the drawings. In addition, in the drawings, substantially the same components are denoted by the same reference numerals, and redundant description thereof will be omitted or simplified.

In addition, in this specification, a term indicating a relationship between elements such as parallel or orthogonal, a term indicating a shape of an element such as a rectangle, and a numerical value range are not expressions representing only a strict meaning, but expressions representing a substantially equivalent range, for example, an expression including a difference of about several percent.

In addition, in this specification, the terms "above" and "below" do not indicate an upward direction (vertically upward) and a downward direction (vertically downward) in absolute spatial recognition, but are used as terms defined by a relative positional relationship based on a stacking order in a stacked configuration. Therefore, for example, the "upper surface" of a component or a member can be not only a surface on the vertically upper side but also various surfaces such as a surface on the vertically lower side or a surface orthogonal to the horizontal direction in an actual use mode.

In this specification and the drawings, an x-axis, a y-axis, and a z-axis represent three axes of a three-dimensional orthogonal coordinate system. When the module substrate has a rectangular shape when viewed in plan, the x-axis and the y-axis are directions parallel to a first side of the rectangular shape and a second side orthogonal to the first side, respectively. The z-axis is the thickness direction of the module substrate. Note that in this specification, the "thickness direction" of the module substrate refers to a direction perpendicular to the main surface of the module substrate.

In addition, in this specification, "being connected" includes not only a case of being directly connected by a connection terminal and/or a wiring conductor but also a case of being electrically connected via another circuit element. In addition, "being connected between A and B" means being connected to both A and B between A and B.

In addition, in the component arrangement of the present disclosure, "the module substrate is viewed in plan" means that an object is viewed by orthographic projection onto the xy plane from the z-axis positive side. Further, "a component is arranged on a substrate" includes not only a case where the component is arranged on the substrate in a state of being in contact with the substrate but also a case where the component is arranged above the substrate without necessarily being in contact with the substrate (for example, a case where the component is stacked on another component that is arranged on the substrate), and a case where a part or all of the component is embedded in the substrate. In addition, "a component is arranged on a main surface of a substrate" includes not only a case where the component is arranged on the main surface in a state of being in contact with the main surface of the substrate but also a case where the component is arranged above the main surface without necessarily being in contact with the main surface and a case where a part of the component is embedded in the substrate from the main surface side.

In addition, unless otherwise specified, ordinal numbers such as "first", "second", and the like in this specification do not mean the number or order of components, but are used to distinguish components of the same type from each other to avoid confusion.

Embodiment

1. Circuit Configuration of Radio Frequency Module and Communication Device

First, a circuit configuration of a radio frequency module and a communication device according to an embodiment will be described with reference to FIG. 1. FIG. 1 is a circuit diagram of a radio frequency module 1 and a communication device 5 according to the embodiment.

1-1. Circuit Configuration of Communication Device

The communication device 5 is a device used in a communication system and is, for example, a mobile terminal such as a smartphone or a tablet computer. As illustrated in FIG. 1, the communication device 5 includes a radio frequency module 1, an antenna 2, an RF signal processing circuit (RFIC) 3, and a baseband signal processing circuit (BBIC) 4.

The radio frequency module 1 transmits a radio frequency signal between the antenna 2 and the RFIC 3. The internal configuration of the radio frequency module 1 will be described later.

The antenna 2 is connected to an antenna connection terminal 100 of the radio frequency module 1, transmits a radio frequency signal (transmission signal) output from the radio frequency module 1, receives a radio frequency signal (reception signal) from the outside, and outputs the radio frequency signal to the radio frequency module 1.

The RFIC 3 is an example of a signal processing circuit that processes radio frequency signals transmitted and received by the antenna 2. Specifically, the RFIC 3 performs signal processing on the radio frequency reception signal input via the reception path of the radio frequency module 1 by down-conversion or the like, and outputs the reception signal generated by the signal processing to the BBIC 4. In addition, the RFIC 3 performs signal processing on the transmission signal input from the BBIC 4 by up-conversion or the like, and outputs the radio frequency transmission signal generated by the signal processing to the transmission path of the radio frequency module 1. Further, the RFIC 3 includes a control unit that controls a switch, an amplifier, and the like included in the radio frequency module 1. Note that a part or all of the functions as the control unit of the RFIC 3 may be implemented outside the RFIC 3, for example, in the BBIC 4 or the radio frequency module 1.

The BBIC 4 is a baseband signal processing circuit that performs signal processing using an intermediate-frequency band lower than a radio frequency signal transmitted by the radio frequency module 1. As the signal processed in the BBIC 4, for example, an image signal for image display and/or an audio signal for communication via a speaker is used.

Note that in the communication device 5 according to the present embodiment, the antenna 2 and the BBIC 4 are optional components.

1-2. Circuit Configuration of Radio Frequency Module

Next, a circuit configuration of the radio frequency module 1 will be described. As illustrated in FIG. 1, the radio frequency module 1 includes a power amplifier 10, a PA control circuit 11, a low noise amplifier 20, matching circuits 31, 32, 41, and 42, switches 51 to 53, and duplexers 61 and 62. In addition, the radio frequency module 1 also includes an antenna connection terminal 100, a control input terminal 111, a radio frequency input terminal 110, and a radio frequency output terminal 120.

The antenna connection terminal 100 is connected to the antenna 2.

The control input terminal 111 is a terminal for receiving a digital signal for controlling the gain of the power amplifier 10 and the power supply voltage and the bias voltage supplied to the power amplifier 10. For example, the control input terminal 111 is a mobile industry processor interface (MIPI) terminal and receives digital signals from the RFIC 3.

The radio frequency input terminal 110 is a terminal for receiving a radio frequency transmission signal from the outside of the radio frequency module 1. In the present embodiment, the radio frequency input terminal 110 is a terminal for receiving the transmission signals of communication bands A and B from the RFIC 3.

The radio frequency output terminal 120 is a terminal for providing a radio frequency reception signal to the outside of the radio frequency module 1. In the present embodiment, the radio frequency output terminal 120 is a terminal for providing the reception signals of the communication bands A and B to the RFIC 3.

Note that the communication band means a frequency band that is defined in advance by a standardization organization (e.g., 3rd Generation Partnership Project (3GPP), Institute of Electrical and Electronics Engineers (IEEE), etc.) or the like for a communication system. Here, the communication system means a communication system constructed by using a radio access technology (RAT). As the communication system, for example, 5th Generation New Radio (5GNR) system, Long Term Evolution (LTE) system, Wireless Local Area Network (WLAN) system, and the like can be used, but the communication system is not limited thereto.

The communication bands A and B are different from each other. In the present embodiment, a communication band for frequency division duplex (FDD) is used as each of the communication bands A and B. Note that as at least one of the communication bands A and B, a communication band for time division duplex (TDD) may be used.

The power amplifier 10 can amplify the transmission signals of the communication bands A and B. Here, the input terminal of the power amplifier 10 is connected to the radio frequency input terminal 110, and the output terminal of the power amplifier 10 is connected to the switch 52.

The configuration of the power amplifier 10 is not particularly limited. For example, the power amplifier 10 may have a single-stage configuration or a multi-stage configuration. For example, the power amplifier 10 may include a plurality of amplifying elements connected in cascade. In addition, the power amplifier 10 may convert a radio frequency signal into a balanced signal and amplify the balanced signal. Such the power amplifier 10 may be referred to as a differential amplifier. Note that the balanced signal means a set of signals having phases opposite to each other. The balanced signal may also be referred to as a differential signal.

The PA control circuit 11 is an example of a control circuit that controls the power amplifier 10. The PA control circuit 11 controls the gain of the power amplifier 10 based on the digital signal input via the control input terminal 111.

The PA control circuit 11 is, for example, one semiconductor integrated circuit. The semiconductor integrated circuit is configured by, for example, a complementary metal oxide semiconductor (CMOS), and specifically, is configured by a silicon on insulator (SOI) process. Thus, the semiconductor integrated circuit can be manufactured at a low cost. Note that the semiconductor integrated circuit may be made of at least one of GaAs, SiGe, and GaN.

The low noise amplifier 20 can amplify the reception signals of the communication bands A and B received by the antenna connection terminal 100. Here, the input terminal of the low noise amplifier 20 is connected to the switch 53, and the output terminal of the low noise amplifier 20 is connected to the radio frequency output terminal 120.

The configuration of the low noise amplifier 20 is not particularly limited. For example, the low noise amplifier 20 may have a single-stage configuration or a multi-stage configuration.

Note that the power amplifier 10 and the low noise amplifier 20 are constituted by, for example, a Si-based CMOS or a field-effect transistor (FET) or a hetero-bipolar transistor (HBT) made of GaAs.

The duplexer 61 is an example of a filter having a pass band including the communication band A. The duplexer 61 allows a radio frequency signal in the communication band A to pass therethrough. The duplexer 61 transmits the transmission signal and the reception signal of the communication band A by the FDD method. The duplexer 61 includes a transmission filter 61T and a reception filter 61R.

The transmission filter 61T has a pass band that includes an uplink operating band of the communication band A. One end of the transmission filter 61T is connected to the antenna connection terminal 100 via the switch 51. The other end of the transmission filter 61T is connected to the output terminal of the power amplifier 10 via the matching circuit 31 and the switch 52.

The uplink operating band refers to a part of a communication band designated for uplink. In the radio frequency module 1, the uplink operating band means the transmission band.

The reception filter 61R has a pass band that includes a downlink operating band of the communication band A. One end of the reception filter 61R is connected to the antenna connection terminal 100 via the switch 51. The other end of the reception filter 61R is connected to the input terminal of the low noise amplifier 20 via the matching circuit 41 and the switch 53.

The downlink operating band refers to a part of a communication band designated for downlink. In the radio frequency module 1, the downlink operating band means the reception band.

The duplexer 62 is an example of a filter having a pass band including the communication band B. The duplexer 62 allows a radio frequency signal in the communication band B to pass therethrough. The duplexer 62 transmits the transmission signal and the reception signal of the communication band B by the FDD method. The duplexer 62 includes a transmission filter 62T and a reception filter 62R.

The transmission filter 62T has a pass band that includes the uplink operating band of the communication band B. One end of the transmission filter 62T is connected to the antenna connection terminal 100 via the switch 51. The other end of the transmission filter 62T is connected to the output terminal of the power amplifier 10 via the matching circuit 32 and the switch 52.

The reception filter 62R has a pass band that includes the downlink operating band of the communication band B. One end of the reception filter 62R is connected to the antenna connection terminal 100 via the switch 51. The other end of the reception filter 62R is connected to the input terminal of the low noise amplifier 20 via the matching circuit 42 and the switch 53.

The transmission filters 61T and 62T and the reception filters 61R and 62R are, for example, any one of an acoustic wave filter using a surface acoustic wave (SAW), an acoustic wave filter using a bulk acoustic wave (BAW), an LC resonant filter, and a dielectric filter, but are not limited thereto.

The switch 51 is connected between the antenna connection terminal 100 and each of the duplexers 61 and 62. The switch 51 is also referred to as an antenna switch. The switch 51 switches (a) the connection between the antenna connection terminal 100 and the transmission filter 61T and the reception filter 61R and (b) the connection between the antenna connection terminal 100 and the transmission filter 62T and the reception filter 62R based on, for example, a control signal from the RFIC 3. The switch 51 is, for example, a single-pole double-throw (SPDT) type switch circuit. Note that the switch 51 may be a multi-connection type switch circuit capable of simultaneously performing the above connections (a) and (b).

The switch 52 is connected between each of the duplexers 61 and 62 and the power amplifier 10. The switch 52 switches the connection between the power amplifier 10 and the transmission filter 61T and the connection between the power amplifier 10 and the transmission filter 62T based on, for example, a control signal from the RFIC 3. The switch 52 is, for example, an SPDT type switch circuit.

The switch 53 is connected between each of the duplexers 61 and 62 and the low noise amplifier 20. The switch 53 switches the connection between the low noise amplifier 20 and the reception filter 61R and the connection between the low noise amplifier 20 and the reception filter 62R based on, for example, a control signal from the RFIC 3. The switch 53 is, for example, an SPDT type switch circuit.

The matching circuit 31 is connected between the transmission filter 61T and the output terminal of the power amplifier 10. Specifically, the matching circuit 31 is connected to the power amplifier 10 via the switch 52. The matching circuit 31 performs impedance matching between the transmission filter 61T and the power amplifier 10.

The matching circuit 32 is connected between the transmission filter 62T and the output terminal of the power amplifier 10. Specifically, the matching circuit 32 is connected to the power amplifier 10 via the switch 52. The matching circuit 32 performs impedance matching between the transmission filter 62T and the power amplifier 10.

The matching circuit 41 is connected between the reception filter 61R and the input terminal of the low noise amplifier 20. Specifically, the matching circuit 41 is connected to the low noise amplifier 20 via the switch 53. The matching circuit 41 performs impedance matching between the reception filter 61R and the low noise amplifier 20.

The matching circuit 42 is connected between the reception filter 62R and the input terminal of the low noise amplifier 20. Specifically, the matching circuit 42 is connected to the low noise amplifier 20 via the switch 53. The matching circuit 42 performs impedance matching between the reception filter 62R and the low noise amplifier 20.

In addition, each of the matching circuits 31, 32, 41, and 42 is formed using at least one of an inductor, a capacitor, and a resistor. For example, each of the matching circuits 31, 32, 41, and 42 includes a chip inductor.

Note that a matching circuit may be provided between the switch 52 and the output terminal of the power amplifier 10 instead of the matching circuits 31 and 32 or in addition to the matching circuits 31 and 32. In addition, a matching circuit may be provided between the switch 53 and the input terminal of the low noise amplifier 20 instead of the matching circuits 41 and 42 or in addition to the matching circuits 41 and 42. Further, a matching circuit may be provided between the switch 51 and the duplexer 61 or 62.

In the radio frequency module 1 having the above-described circuit configuration, the power amplifier 10, the switch 52, the matching circuit 31, and the transmission filter 61T constitute a first transmission circuit that outputs a transmission signal in the communication band A to the antenna connection terminal 100. In addition, the power amplifier 10, the switch 52, the matching circuit 32, and the transmission filter 62T constitute a second transmission circuit that outputs a transmission signal in the communication band B to the antenna connection terminal 100.

In addition, the low noise amplifier 20, the switch 53, the matching circuit 41, and the reception filter 61R constitute a first reception circuit that receives a reception signal in the communication band A from the antenna 2 via the antenna connection terminal 100. In addition, the low noise amplifier 20, the switch 53, the matching circuit 42, and the reception filter 62R constitute a second reception circuit that receives a reception signal in the communication band B from the antenna 2 via the antenna connection terminal 100.

According to the above-described circuit configuration, the radio frequency module 1 according to the present embodiment can execute at least one of (1) transmission and reception of a radio frequency signal in the communication band A, (2) transmission and reception of a radio frequency signal in the communication band B, and (3) simultaneous transmission, simultaneous reception, or simultaneous transmission and reception of a radio frequency signal in the communication band A and a radio frequency signal in the communication band B.

Note that in the radio frequency module 1 according to the present embodiment, the transmission circuit and the reception circuit need not be connected to the antenna connection terminal 100 via the switch 51, and the above transmission circuit and the reception circuit may be connected to the antenna 2 via different terminals.

In addition, some of the circuit elements illustrated in FIG. 1 need not be included in the radio frequency module 1. For example, the radio frequency module 1 may include only a transmission circuit that transmits a transmission signal, and in this case, the radio frequency module 1 need not include the low noise amplifier 20, the matching circuits 41 and 42, the switch 53, and the reception filters 61R and 62R. In addition, the radio frequency module 1 may include only a reception circuit that transmits a reception signal, and in this case, the radio frequency module 1 need not include the power amplifier 10, the matching circuits 31 and 32, the switch 52, and the transmission filters 61T and 62T. In addition, the radio frequency module 1 may transmit a radio frequency signal of only one communication band, and in this case, the radio frequency module 1 need not include the switch 51, the matching circuits 32 and 42, and the duplexer 62.

2. Component Arrangement of Radio Frequency Module

Next, an example of a component arrangement of the radio frequency module 1 will be described with reference to FIG. 2A, FIG. 2B, and FIG. 3.

Figure 2A:
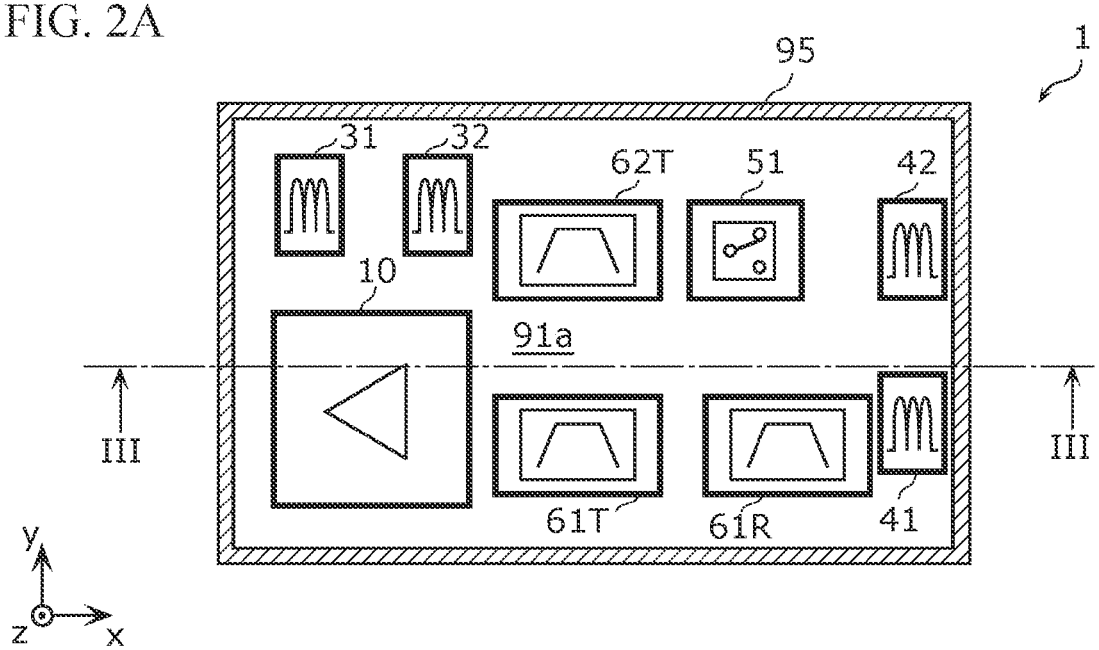
FIG. 2A is a plan view illustrating a component arrangement of the radio frequency module according to the embodiment.
Figure 2B:
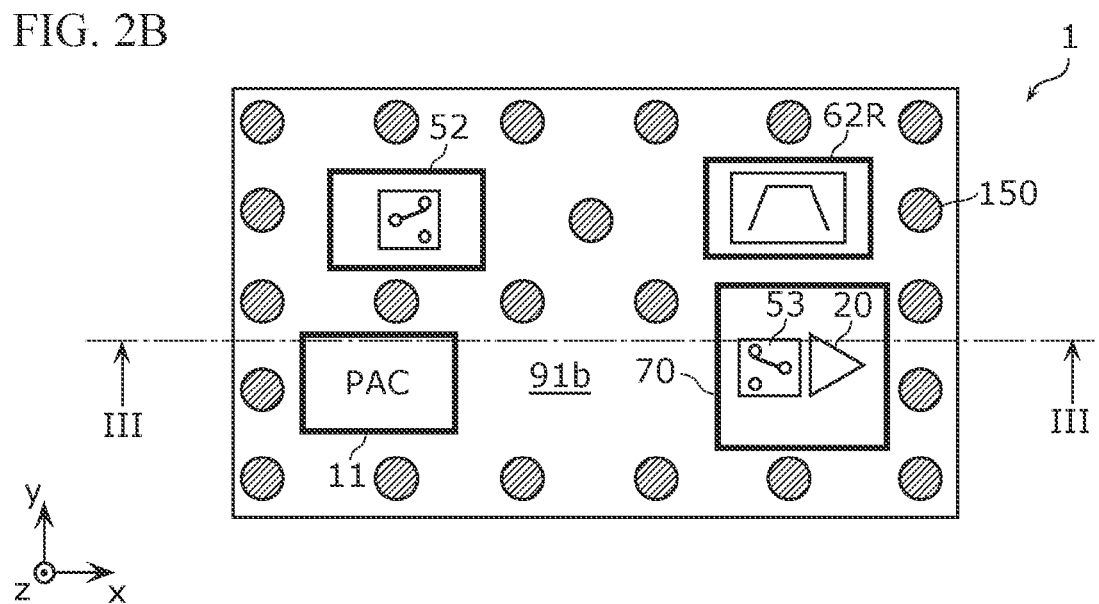
FIG. 2B is a plan view illustrating a component arrangement of the radio frequency module according to the embodiment.

FIG. 2A and FIG. 2B each are a plan view illustrating a component arrangement of the radio frequency module 1 according to the present embodiment. FIG. 2A illustrates the arrangement of components and members arranged on a main surface 91a when the main surface 91a of a module substrate 91 is viewed from the positive side of the z-axis. FIG. 2B illustrates the arrangement of components and members arranged on a main surface 91b when the main surface 91b of the module substrate 91 is viewed from the positive side of the z-axis. Note that since the main surface 91b faces the negative side of the z-axis, FIG. 2B is a plan view seen through components and members located on the main surface 91a side of the module substrate 91 and the module substrate 91.

Figure 3:
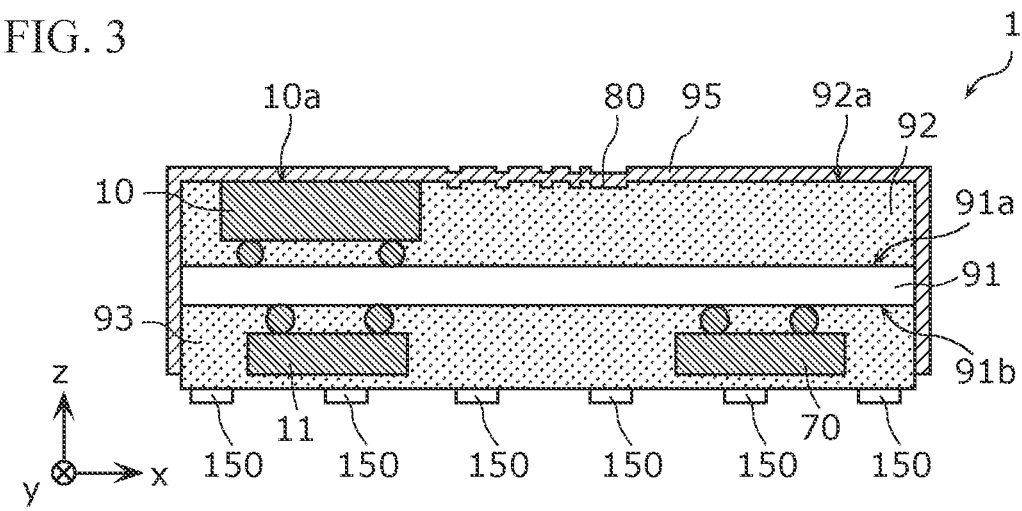
FIG. 3 is a sectional view of the radio frequency module according to the embodiment.

FIG. 3 is a sectional view of the radio frequency module 1 according to the present embodiment. FIG. 3 illustrates a cross section taken along line III-III in FIG. 2A and FIG. 2B. Note that in FIG. 3, the cross-section of the module substrate 91 is not shaded for the sake of clarity.

As illustrated in FIG. 2A, FIG. 2B, and FIG. 3, the radio frequency module 1 includes, in addition to the circuit configuration illustrated in FIG. 1, an engraved portion 80 (see FIG. 4), the module substrate 91, resin members 92 and 93, a metal shield layer 95, and an external connection terminal 150.

The module substrate 91 has the main surface 91a and the main surface 91b opposite to the main surface 91a. Although the module substrate 91 has a rectangular shape when viewed in plan, the shape of the module substrate 91 is not limited thereto. As the module substrate 91, for example, a low temperature co-fired ceramics (LTCC) substrate, a high temperature co-fired ceramics (HTCC) substrate, a component-embedded substrate, a substrate having a redistribution layer (RDL), a printed substrate, or the like can be used, the above-described substrates having a laminated structure of a plurality of dielectric layers, but the module substrate 91 is not limited thereto.

The main surface 91*a* may be referred to as an upper surface or a front surface. One or more circuit components are arranged on the main surface 91*a*. Each of the one or more circuit components is a surface mount device (SMD). Specifically, the circuit component is an integrated circuit (IC), an integrated passive device (IPD), a discrete passive component such as a chip inductor or a chip capacitor, or the like. In the present embodiment, as illustrated in FIG. 2A, the plurality of circuit components arranged on the main surface 91*a* is the power amplifier 10, the matching circuits 31, 32, 41, and 42, the switch 51, the transmission filters 61T and 62T, and the reception filter 61R. Note that the matching circuits 31, 32, 41, and 42 are chip inductors, for example.

The plurality of circuit components arranged on the main surface 91*a* includes one or more first circuit components whose top surfaces are not covered with the resin member 92 and one or more second circuit components whose top surfaces are covered with the resin member 92. The one or more first circuit components are, for example, the power amplifier 10 and the transmission filters 61T and 62T. The one or more second circuit components are the matching circuits 31, 32, 41, and 42, the switch 51, and the reception filter 61R.

Note that the top surface corresponds to a main surface opposite to the main surface on the module substrate 91 side among a plurality of main surfaces of the circuit component. For example, the top surface of the circuit component arranged on the main surface 91*a* corresponds to the upper surface (main surface on the positive side of the z-axis) of the circuit component. The same applies to the top surface of the resin member 92.

The main surface 91*b* may be referred to as a lower surface or a rear surface. One or more circuit components are arranged on the main surface 91*b*. In the present embodiment, as illustrated in FIG. 2B, the plurality of circuit components arranged on the main surface 91*b* is the PA control circuit 11, the switch 52, the reception filter 62R, and a semiconductor integrated circuit 70 including the low noise amplifier 20 and the switch 53. Further, the plurality of external connection terminals 150 is arranged on the main surface 91*b*.

The semiconductor integrated circuit 70 is an electronic component having an electronic circuit formed on the surface and inside of a semiconductor chip (also referred to as a die). In the example illustrated in FIG. 2B, the semiconductor integrated circuit 70 includes the low noise amplifier 20 and the switch 53. The semiconductor integrated circuit 70 is formed by, for example, a CMOS, and specifically may be formed by an SOI process. This makes it possible to manufacture the semiconductor integrated circuit 70 at low cost. Note that the semiconductor integrated circuit 70 may be made of at least one of GaAs, SiGe, and GaN. Thus, the semiconductor integrated circuit 70 of high quality can be realized.

The plurality of external connection terminals 150 includes the antenna connection terminal 100, the control input terminal 111, the radio frequency input terminal 110, and the radio frequency output terminal 120 illustrated in FIG. 1. In addition, the plurality of external connection terminals 150 includes a ground terminal. Each of the plurality of external connection terminals 150 is connected to an input/output terminal and/or a ground terminal on the motherboard arranged on the z-axis negative side of the radio frequency module 1. The plurality of external connection terminals 150 is a post electrode penetrating the resin member 93 covering the main surface 91*b*.

The resin member 92 is arranged on the main surface 91*a* of the module substrate 91 and covers the main surface 91*a* and the side surfaces of the one or more circuit components arranged on the main surface 91*a*. In the present embodiment, the resin member 92 further covers the top surfaces of one or more circuit components among the plurality of circuit components arranged on the main surface 91*a*. For example, the resin member 92 covers the top surface of each of the matching circuits 31, 32, 41, and 42, the switch 51, and the reception filter 61R. The top surfaces of the power amplifier 10 and the transmission filters 61T and 62T are exposed without necessarily being covered with the resin member 92. Note that "covering a surface" means covering at least a part of the surface, and means not only covering the entire surface but also covering only a part of the surface.

The resin member 93 is arranged on the main surface 91*b* of the module substrate 91 and covers the main surface 91*b* and the side surfaces of the one or more circuit components arranged on the main surface 91*b*. To be specific, the resin member 92 covers the side surfaces and the top surface (lower surface) of each of the circuit components arranged on the main surface 91*b*. Note that at least one of the plurality of circuit components arranged on the main surface 91*b* need not be covered with the resin member 93.

The metal shield layer 95 is one example of the metal layer and in contact with a top surface 92*a* of the resin member 92 and the top surfaces of the one or more first circuit components arranged on the main surface 91*a*. To be specific, as illustrated in FIG. 3, the metal shield layer 95 is in contact with a top surface 10*a* of the power amplifier 10, a top surface 61Ta of the transmission filter 61T, and a top surface 62Ta of the transmission filter 62T (see FIG. 4). In the present embodiment, the metal shield layer 95 is in contact with and covers the top surface 92*a* of the resin member 92, the top surface 10*a* of the power amplifier 10, the top surface 61Ta of the transmission filter 61T, the top surface 62Ta of the transmission filter 62T, and the side surfaces of each of the resin member 92, the module substrate 91, and the resin member 93.

The metal shield layer 95 is, for example, a metal thin film formed by sputtering. For example, on the side surface of the module substrate 91, the metal shield layer 95 is electrically connected to a ground-electrode pattern provided on the main surface 91*a*, the inside, or the main surface 91*b* of the module substrate 91. As a result, the metal shield layer 95 is set to the ground potential and suppresses external noise from entering the circuit components included in the radio frequency module 1.

In the radio frequency module 1, for example, after the circuit components are arranged on the main surface 91*a* of the module substrate 91, the circuit components and the entire main surface 91*a* are molded using liquid resin. At this time, the top surfaces of the circuit components that are to be exposed (specifically, the power amplifier 10 and the transmission filters 61T and 62T) may also be covered with the liquid resin. After the liquid resin is cured, the cured resin is polished. At this time, parts of the power amplifier 10 and the transmission filters 61T and 62T may also be polished at the same time. This allows the top surface 10*a* of the power amplifier 10, the top surface 61Ta of the transmission filter 61T, the top surface 62Ta of the transmission filter 62T, and the top surface 92*a* of the resin member 92 to be flush with each other.

Thereafter, the engraved portion 80 is formed on the top surface 92*a* of the resin member 92, and then a metal film is formed by sputtering so as to cover the top surface 10a of the power amplifier 10, the top surface 61Ta of the transmission filter 61T, the top surface 62Ta of the transmission filter 62T, and the top surface 92a and side surfaces of the resin member 92. Thus, the metal shield layer 95 is formed. Note that the engraved portion 80 is formed by laser processing, for example, but may be formed after the metal shield layer 95 is formed.

3. Engraved Portion

Next, the engraved portion 80 included in the radio frequency module 1 will be described with reference to FIG. 4.

Figure 4:
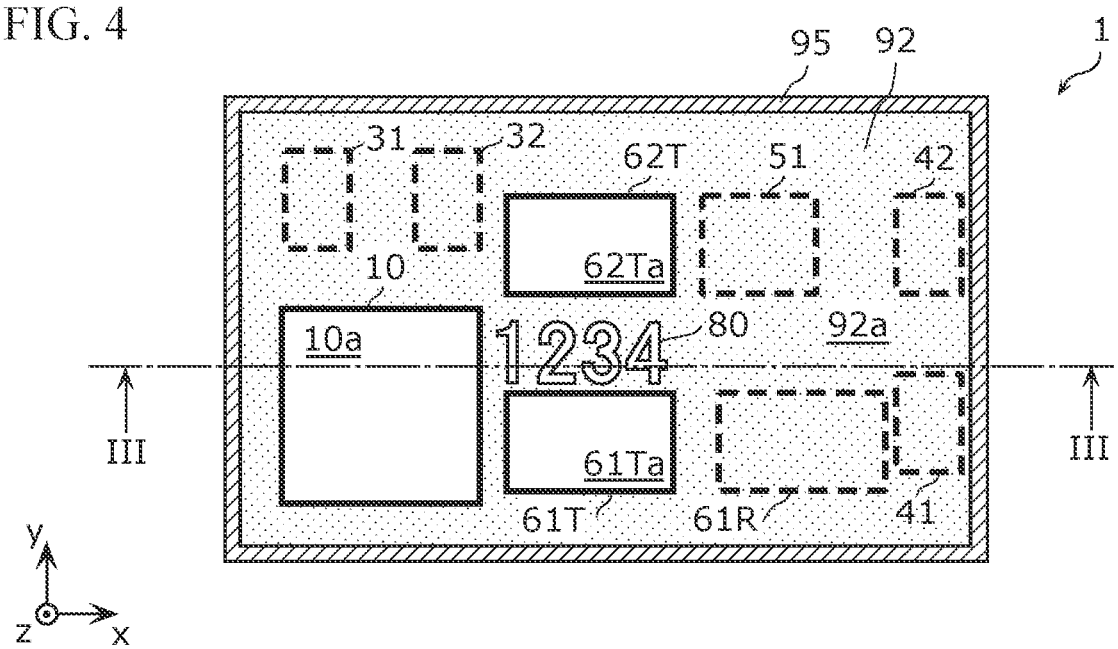
FIG. 4 is a plan view illustrating an arrangement of an engraved portion of the radio frequency module according to the embodiment.

FIG. 4 is a plan view illustrating the engraved portion 80 of the radio frequency module 1 according to the present embodiment. To be specific, FIG. 4 illustrates the top surface 92a of the resin member 92 through the top surface portion of the metal shield layer 95. The top surface 10a of the power amplifier 10, the top surface 61Ta of the transmission filter 61T, and the top surface 62Ta of the transmission filter 62T are not covered with the resin member 92. Further, in FIG. 4, of the circuit components illustrated in FIG. 2A, components whose top surfaces are covered with the resin member 92 are indicated by broken lines.

The engraved portion 80 indicates predetermined information about the radio frequency module 1. The predetermined information is a model number, a lot number at the time of manufacture, and/or a manufacturer name of the radio frequency module 1. The engraved portion 80 includes a character, a figure, or a symbol. The character is an alphabet or a number, but may be a Hiragana, Katakana, Kanji, or the like. In the example illustrated in FIG. 4, the engraved portion 80 includes four characters "1234".

Note that the engraved portion 80 may include a two-dimensional code. The two-dimensional code is, for example, a QR code (registered trademark). The two-dimensional code represents, for example, a uniform resource locator (URL) indicating a Web page that presents information related to the radio frequency module 1.

The engraved portion 80 is provided on the top surface 92a of the resin member 92 covering the main surface 91a. The engraved portion 80 does not overlap the first circuit component whose top surface is not covered with the resin member 92 when viewed in plan. To be specific, the engraved portion 80 does not overlap any of the power amplifier 10 and the transmission filters 61T and 62T.

In the present embodiment, as illustrated in FIG. 4, the engraved portion 80 does not overlap any of all the circuit components arranged on the main surface 91a when viewed in plan. Note that in the present embodiment, the circuit component is an SMD component and does not mean a simple conductive member such as a wiring and an electrode. That is, the engraved portion 80 may overlap the wiring and the electrode when viewed in plan.

The engraved portion 80 is formed by a groove and/or a concave portion provided on the top surface 92a of the resin member 92. For example, the engraved portion 80 is a plurality of grooves formed along a line of a character. The engraved portion 80 is formed by, for example, irradiating the top surface 92a of the resin member 92 with laser light and cutting a part of the surface layer portion of the resin member 92. Note that the engraved portion 80 may be a character (convex portion) raised by cutting off a portion other than the line of the character.

In the present embodiment, the metal shield layer 95 is provided so as to cover the engraved portion 80. The depth of the groove and/or the concave portion forming the engraved portion 80 is longer than the thickness of the metal shield layer 95. The depth of the groove and/or the concave portion of the engraved portion 80 is, for example, equal to or more than 20 μm and equal to or less than 30 μm. On the other hand, the thickness of the metal shield layer 95 is, for example, about 10 μm. The metal shield layer 95 is formed with a uniform film thickness so as to follow the uneven shape of the engraved portion 80. Therefore, on the surface (upper surface) of the metal shield layer 95, unevenness equivalent to the engraved portion 80 is formed. Thus, even when the engraved portion 80 is covered with the metal shield layer 95, the engraved portion 80 can be visually recognized from the outside.

When a part of the engraved portion 80 is formed on the top surface of the circuit component (the power amplifier 10, the transmission filter 61T or 62T) whose top surface is exposed, the visibility of the engraved portion 80 is deteriorated. This is mainly due to the difference in material between the circuit component and the resin member 92. Due to the difference in material, the depth of the groove and/or the concave portion formed by the laser is different between the circuit component and the resin member 92. Specifically, the groove and/or the concave portion formed in the circuit component is shallower than the groove and/or the concave portion formed in the resin member 92. Therefore, the visibility of the groove and/or the concave portion formed in the circuit component is deteriorated, so that a case may occur in which correct characters cannot be recognized.

In order to ensure visibility, it is desirable to form grooves and/or concave portions having the same depth in the resin member 92 and the circuit component. For this purpose, it is suitable to change the laser output, and the number of steps of the laser processing increases, so that the time required for forming the engraved portion 80 also increases. In addition, when the surface of the substrate or the cover member of the circuit component is irradiated with the laser beam, the electrical characteristics of the circuit component may be deteriorated.

On the other hand, in the radio frequency module 1 according to the present embodiment, the engraved portion 80 is provided on the top surface 92a of the resin member 92 so as not to overlap any of the circuit components arranged on the main surface 91a. That is, since the entire engraved portion 80 is provided in the resin member 92, variation in the depth of the groove and/or the concave portion is suppressed, and the visibility of the engraved portion 80 can be enhanced. In addition, since the circuit component is not irradiated with the laser beam, deterioration of electrical characteristics of the circuit component is suppressed.

In the present embodiment, the top surface 10a of the power amplifier 10, the top surface 61Ta of the transmission filter 61T, and the top surface 62Ta of the transmission filter 62T, which are not covered with the resin member 92, are each in contact with the metal shield layer 95. Thus, heat generated in the power amplifier 10 and the transmission filters 61T and 62T is easily dissipated through the metal shield layer 95.

In addition, since the metal shield layer 95 includes unevenness along the engraved portion 80, the surface area of the metal shield layer 95 increases in the vicinity of the engraved portion 80. That is, in the vicinity of the engraved portion 80, the contact area between the metal shield layer 95 and the air is increased, so that the heat dissipation is enhanced.

From the viewpoint of heat dissipation, the engraved portion 80 is provided closer to the first circuit component not covered with the resin member 92 than to the second circuit component covered with the resin member 92. That is, when viewed in plan, the distance between the engraved portion 80 and the first circuit component is shorter than the distance between the engraved portion 80 and the second circuit component. Note that "the distance between A and B" means "the shortest distance between A and B", that is, the distance between a point in A, which is closest to B, and a point in B, which is closest to A.

In the present embodiment, among all the circuit components arranged on the main surface 91a, the circuit component closest to the engraved portion 80 when viewed in plan is the first circuit component that is not covered with the resin member 92. For example, in the example illustrated in FIG. 4, the engraved portion 80 is provided closest to the transmission filter 61T, and provided secondarily close to the power amplifier 10 and the transmission filter 62T in this order. Among the plurality of circuit components covered with the resin member 92, the switch 51 is provided closest to the engraved portion 80. The distance between the engraved portion 80 and the switch 51 is longer than the distance between the engraved portion 80 and each of the transmission filter 61T, the power amplifier 10, and the transmission filter 62T.

As a result, heat generated in the power amplifier 10 and the transmission filters 61T and 62T is transmitted to the metal shield layer 95, and is quickly radiated by the unevenness caused by the engraved portion 80. Therefore, the heat dissipation of the radio frequency module 1 can be enhanced.

4. Effects and the Like

As described above, the radio frequency module 1 according to the present embodiment includes the module substrate 91 having the main surface 91a, the first circuit component arranged on the main surface 91a, the resin member 92 arranged on the main surface 91a and covering the side surface of the first circuit component, the metal shield layer 95 in contact with the top surface 92a of the resin member 92 and the top surface of the first circuit component, and the engraved portion 80 provided on the top surface 92a of the resin member 92. When the main surface 91a is viewed in plan, the engraved portion 80 does not overlap the first circuit component.

As a result, the metal shield layer 95 and the first circuit component are in contact with each other, so that heat generated in the first circuit component is easily transmitted to the metal shield layer 95. Thus, the radio frequency module 1 having excellent heat dissipation is realized. In addition, the entire engraved portion 80 is provided on the top surface 92a of the resin member 92, and a part of the engraved portion 80 is not formed on a member different from the resin member 92. Therefore, for example, by keeping the output constant using a laser or the like, it is possible to form grooves and/or concave portions having a uniform depth as the engraved portion 80. Thus, the visibility of the engraved portion 80 can be enhanced.

Further, since the engraved portion 80 is not provided on the circuit component, the circuit component is not irradiated with the laser beam. Therefore, the circuit component is not damaged, and deterioration of electrical characteristics of the circuit component can be suppressed.

Note that for example, when a portion of the top surface 92a of the resin member 92 covering the chip inductor (for example, the matching circuit 31), the portion being directly above the chip inductor, is irradiated with the laser beam, the Q value of the chip inductor located directly below the portion is likely to deteriorate.

On the other hand, according to the present embodiment, the engraved portion 80 does not overlap any of all the circuit components arranged on the main surface 91a when viewed in plan.

As a result, it is possible to further reduce the possibility that the laser for forming the engraved portion 80 causes damage to the circuit component, and it is possible to suppress deterioration of electrical characteristics of the circuit component.

Also, for example, the one or more circuit components further include a second circuit component that is not in contact with the metal shield layer 95. The top surface of the second circuit component is covered with the resin member 92. When viewed in plan, the distance between the engraved portion 80 and the first circuit component is shorter than the distance between the engraved portion 80 and the second circuit component. In addition, for example, the first circuit component is a circuit component closest to the engraved portion 80 when viewed in plan among all the circuit components arranged on the main surface 91a.

As a result, since the unevenness caused by the engraved portion 80 is provided in the portion of the metal shield layer 95 near the first circuit component that requires high heat dissipation properties, the surface area of the metal shield layer 95 can be increased and the heat dissipation can be enhanced. As a result, the heat dissipation of the radio frequency module 1 can be further enhanced.

Further, for example, the first circuit component includes a filter having a pass band in a radio frequency band. Further, for example, the first circuit component includes the power amplifier 10 that amplifies a transmission signal.

As a result, it is possible to enhance the heat dissipation of the component that easily generates heat.

Also, for example, the top surface of the first circuit component is flush with the top surface 92a of the resin member 92.

As a result, the metal shield layer 95 can smoothly cover the top surface 92a of the resin member 92 and the top surface of the circuit component without necessarily an uneven surface. With reduced unevenness, it is possible to form the metal shield layer 95 having a high shield effect with a uniform film thickness.

In addition, for example, the engraved portion 80 includes a character, a figure, a symbol, or a two-dimensional code.

Thus, a person can be easily informed of predetermined information by characters or the like. Further, by using the two-dimensional code, it is possible to notify a person of more information.

In addition, the communication device 5 according to the present embodiment includes the RFIC 3 that processes a radio frequency signal transmitted and received by the antenna 2, and the radio frequency module 1 that transmits a radio frequency signal between the antenna 2 and the RFIC 3.

Accordingly, it is possible to realize the communication device 5 including the radio frequency module 1 having excellent heat dissipation and high visibility of the engraving.

5. Modification

Here, a modification of the embodiment will be described. In the following description, differences from the embodiment will be mainly described, and description of common points will be omitted or simplified.

Figure 5:
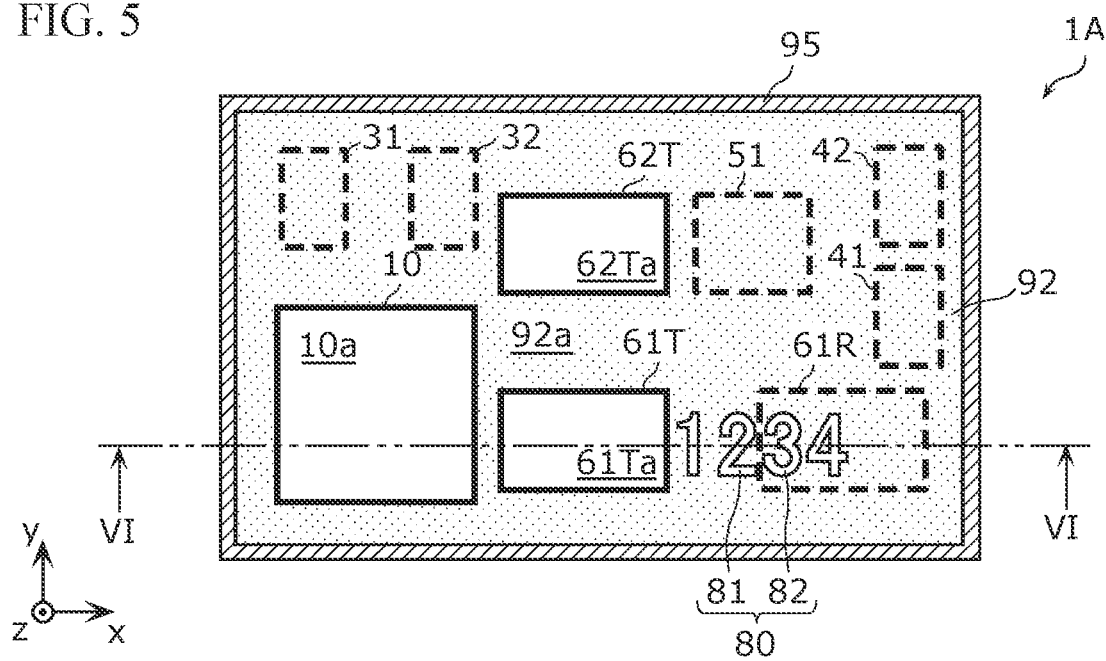
FIG. 5 is a plan view illustrating an arrangement of an engraved portion of a radio frequency module according to a modification of the embodiment.

In the embodiment, an example in which the engraved portion 80 does not overlap any of all the circuit components arranged on the main surface 91a when viewed in plan has been described, but the present disclosure is not limited thereto. As illustrated in FIG. 5, a part of the engraved portion 80 may overlap the circuit component arranged on the main surface 91a when viewed in plan.

Figure 6:
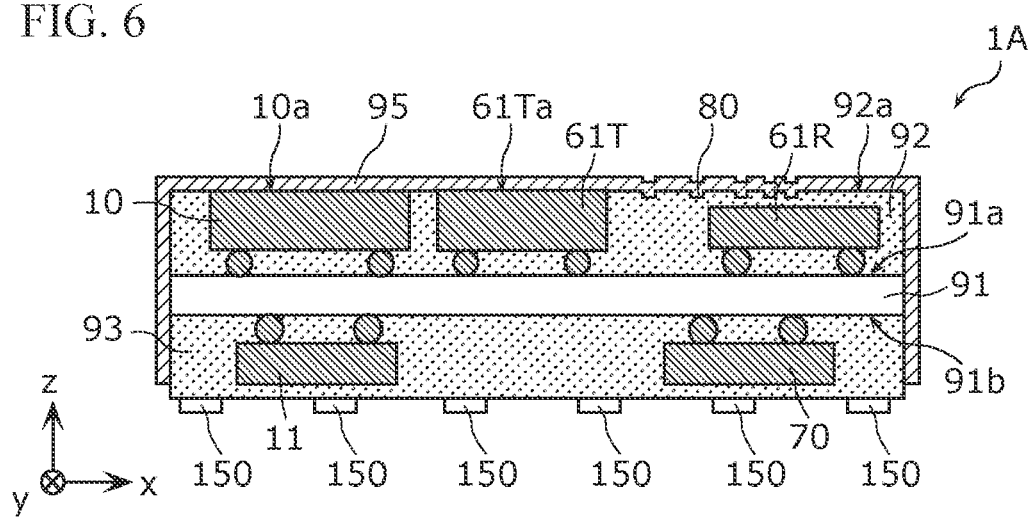
FIG. 6 is a sectional view of a radio frequency module according to a modification of the embodiment.

FIG. 5 is a plan view illustrating an arrangement of the engraved portion 80 of a radio frequency module 1A according to the modification. FIG. 6 is a sectional view of the radio frequency module 1A according to this modification. FIG. 6 illustrates a cross section taken along line VI-VI in FIG. 5.

As illustrated in FIG. 5 and FIG. 6, the engraved portion 80 includes a first portion 81 and a second portion 82. The engraved portion 80 is entirely provided on the top surface 92a of the resin member 92. The first portion 81 is a portion that does not overlap any of the circuit components arranged on the main surface 91a when viewed in plan. The second portion 82 is a portion that overlaps the second circuit component arranged on the main surface 91a, the top surface of the second circuit component being covered with the resin member, when viewed in plan. In this modification, the second portion 82 overlaps the reception filter 61R, but may overlap at least one of the matching circuits 31, 32, 41, and 42, and the switch 51. The engraved portion 80 may overlap a plurality of second circuit components so as to ride thereover.

The first portion 81 includes two characters of "12". The second portion 82 includes two characters of "34". The combination of the first portion 81 and the second portion 82 represents one piece of information (for example, a model number).

Note that the number of characters included in the first portion 81 and the number of characters included in the second portion 82 need not be the same, and may be different. Each of the first portion 81 and the second portion 82 includes one or more characters. Alternatively, at least one of the first portion 81 and the second portion 82 need not be a character, or may include a figure, a symbol, or a two-dimensional code instead of a character.

As described above, in the radio frequency module 1A according to this modification, a part of the engraved portion 80 overlaps the second circuit component when viewed in plan.

Accordingly, it is possible to increase the degree of freedom in the arrangement of the engraved portion 80. In addition, even when the number of circuit components arranged on the main surface 91a is increased and the region not overlapping any circuit component is reduced, the engraved portion 80 can be provided using the region directly above the second circuit component whose top surface is covered with the resin member 92.

Further, for example, the second circuit component includes a filter having a pass band in a radio frequency band.

This increases the surface area of a portion of the metal shield layer 95 located directly above the reception filter 61R, thereby increasing the heat dissipation of the portion. Therefore, heat generated in the reception filter 61R can be efficiently radiated.

In addition, for example, the engraved portion 80 is arranged closer to the end of the main surface 91a than the center of the main surface 91a when viewed in plan. To be specific, the shortest distance between the engraved portion 80 and the end of the main surface 91a is shorter than the shortest distance between the power amplifier 10 and the center of the main surface 91a. The end of the main surface 91a is one point on the contour of the main surface 91a when viewed in plan. For example, the engraved portion 80 is arranged closer to one of the four corners (apexes) of the main surface 91a than the center of the main surface 91a.

As described above, since the engraved portion 80 is arranged at a biased position of the radio frequency module 1A, the engraved portion 80 can be used to determine the orientation (for example, rotation) of the radio frequency module 1A. In addition, by arranging the engraved portion 80 at the end, circuit components connected to the metal shield layer 95, such as the power amplifier 10 or the transmission filter 61T or 62T, can be arranged near the center of the main surface 91a. As a result, heat dissipation of these circuit components can be enhanced.

Note that the top surface of at least one of the power amplifier 10 and the transmission filters 61T and 62T may be covered with the resin member 92. In this case, the engraved portion 80 may be provided so as to overlap the power amplifier 10 and the transmission filters 61T and 62T when viewed in plan.

Others

Although the radio frequency module and the communication device according to the present disclosure have been described based on the above-described embodiments and the like, the present disclosure is not limited to the above-described embodiments.

For example, the thickness of the metal shield layer 95 may be thicker than the depth of the engraved portion 80. Further, for example, the metal shield layer 95 need not cover at least a part of the engraved portion 80.

For example, at least one of the power amplifier 10 and the transmission filters 61T and 62T may be covered with the resin member 92. That is, the type of the circuit component in contact with the metal shield layer 95 is not particularly limited.

Further, for example, the allocation of the arrangement of the plurality of circuit components included in the radio frequency module to the main surfaces 91a and 91b of the module substrate 91 is not particularly limited. For example, the PA control circuit 11 may be arranged on the main surface 91a, and the transmission filter 61T or 62T may be arranged on the main surface 91b. Alternatively, all the circuit components may be arranged on the main surface 91a, or no circuit component may be arranged on the main surface 91b.

For example, the radio frequency module need not include the resin member 93 that covers the main surface 91b. In addition, for example, the external connection terminal 150 may be a bump electrode or a planar electrode.

In addition, for example, the top surface of the circuit component, which is not covered with the resin member 92, need not be flush with the top surface 92a of the resin member 92. For example, a step may be provided between the top surface 10a of the power amplifier 10 and the top surface 92a of the resin member 92.

In addition, an embodiment obtained by applying various modifications conceived by a person skilled in the art to each embodiment and an embodiment realized by arbitrarily combining constituent elements and functions in each embodiment without necessarily departing from the gist of the present disclosure are also included in the present disclosure.

INDUSTRIAL APPLICABILITY

The present disclosure can be widely used in communication devices such as mobile phones as a radio frequency module arranged in a front end portion compatible with multi-band.

REFERENCE SIGNS LIST 1, 1A RADIO FREQUENCY MODULE
2 ANTENNA
3 RFIC
4 BBIC
5 COMMUNICATION DEVICE
10 POWER AMPLIFIER
10a, 61Ta, 62Ta, 92a TOP SURFACE
11 PA CONTROL CIRCUIT
20 LOW NOISE AMPLIFIER
31, 32, 41, 42 MATCHING CIRCUIT
51, 52, 53 SWITCH
61, 62 DUPLEXER
61R, 62R RECEPTION FILTER
61T, 62T TRANSMISSION FILTER
70 SEMICONDUCTOR INTEGRATED CIRCUIT
80 ENGRAVED PORTION
81 FIRST PORTION
82 SECOND PORTION
91 MODULE SUBSTRATE
91a, 91b MAIN SURFACE
92, 93 RESIN MEMBER
95 METAL SHIELD LAYER
100 ANTENNA CONNECTION TERMINAL
110 RADIO FREQUENCY INPUT TERMINAL
111 CONTROL INPUT TERMINAL
120 RADIO FREQUENCY OUTPUT TERMINAL
150 EXTERNAL CONNECTION TERMINAL

The invention claimed is:

1. A radio frequency module comprising:
a module substrate having a main surface;
a first circuit component on the main surface;
a resin on the main surface and covering a side surface of the first circuit component;
a metal layer in contact with a top surface of the resin and a top surface of the first circuit component; and
an engraved portion on a top surface of the resin,
wherein the engraved portion does not overlap the first circuit component in a plan view of the module substrate.

2. The radio frequency module according to claim 1, comprising a plurality of circuit components on the main surface, the plurality of circuit components comprising the first circuit component,
wherein the engraved portion does not overlap any of the plurality of circuit components on the main surface in the plan view.

3. The radio frequency module according to claim 1, further comprising a second circuit component that is not in contact with the metal layer,
wherein a top surface of the second circuit component is covered with the resin, and
a distance between the engraved portion and the first circuit component is shorter than a distance between the engraved portion and the second circuit component in the plan view.

4. The radio frequency module according to claim 1, comprising a plurality of circuit components on the main surface, the plurality of circuit components comprising the first circuit component,
wherein, among all of the plurality of circuit components, the first circuit component is closest to the engraved portion in the plan view.

5. The radio frequency module according to claim 1, further comprising a second circuit component that is not in contact with the metal layer,
wherein a top surface of the second circuit component is covered with the resin, and
wherein a part of the engraved portion overlaps the second circuit component in the plan view.

6. The radio frequency module according to claim 5, wherein the second circuit component comprises a filter having a pass band in a radio frequency band.

7. The radio frequency module according to claim 1, wherein the first circuit component comprises a filter having a pass band in a radio frequency band.

8. The radio frequency module according to claim 1, wherein the first circuit component comprises a power amplifier configured to amplify a transmission signal.

9. The radio frequency module according to claim 1, wherein the engraved portion is closer to an end of the main surface than to a center of the main surface in the plan view.

10. The radio frequency module according to claim 1, wherein a top surface of the first circuit component is flush with a top surface of the resin.

11. The radio frequency module according to claim 1, wherein the engraved portion comprises an engraving of a character, a figure, a symbol, or a two-dimensional code.

12. A communication device comprising:
a radio frequency (RF) signal processing circuit configured to process a radio frequency signal transmitted and received by an antenna; and
the radio frequency module according to claim 1, configured to pass the radio frequency signal between the antenna and the RF signal processing circuit.

* * * * *